US009558108B2

(12) United States Patent
Chang et al.

(10) Patent No.: US 9,558,108 B2
(45) Date of Patent: Jan. 31, 2017

(54) HALF BLOCK MANAGEMENT FOR FLASH STORAGE DEVICES

(71) Applicant: MACRONIX INTERNATIONAL CO., LTD., Hsinchu (TW)

(72) Inventors: Yu-Ming Chang, Pingtung (TW); Yung-Chun Li, New Taipei (TW); Hsing-Chen Lu, Hsinchu (TW); Hsiang-Pang Li, Hsingchu (TW); Cheng-Yuan Wang, Taipei (TW); Yuan-Hao Chang, Taipei (TW); Tei-Wei Kuo, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 434 days.

(21) Appl. No.: 14/018,149

(22) Filed: Sep. 4, 2013

(65) Prior Publication Data

US 2014/0310447 A1    Oct. 16, 2014

Related U.S. Application Data

(60) Provisional application No. 61/811,821, filed on Apr. 15, 2013.

(51) Int. Cl.
*G06F 12/00* (2006.01)
*G06F 12/02* (2006.01)
(Continued)

(52) U.S. Cl.
CPC ....... *G06F 12/0246* (2013.01); *G11C 16/0483* (2013.01); *G11C 16/16* (2013.01); *G11C 16/3427* (2013.01); *G06F 2212/7205* (2013.01)

(58) Field of Classification Search
CPC .................. G06F 12/0246; G06F 2212/7205; G11C 16/3427; G11C 16/16; G11C 16/0483
See application file for complete search history.

(56) References Cited

U.S. PATENT DOCUMENTS 5,404,485 A    4/1995 Ban
5,905,993 A    5/1999 Shinohara
(Continued)

OTHER PUBLICATIONS

Chang, Kuo-Pin et al., "Memory Architecture of 3D Vertical Gate (3DVG) NAND Flash Using Plural Island-Gate SSL Decoding Method and Study of it's Program Inhibit Characteristics," 2012 4th IEEE International Memory Workshop (IMW), May 20-23, 2012, 4 pages.
(Continued)

*Primary Examiner* — David X Yi
*Assistant Examiner* — Alan Otto
(74) *Attorney, Agent, or Firm* — Haynes Beffel & Wolfeld LLP

(57) ABSTRACT

A method for managing block erase operations is provided for an array of memory cells including erasable blocks of memory cells in the array. The method comprises maintaining status data for a plurality of sub-blocks of the erasable blocks of the array. The status data indicate whether the sub-blocks are currently accessible and whether the sub-blocks are invalid. The method comprises, in response to a request to erase a selected sub-block of a particular erasable block, issuing an erase command to erase the particular block if the other sub-blocks of the particular erasable block are invalid, else updating the status data to indicate that the selected sub-block is invalid.

17 Claims, 5 Drawing Sheets

(51) Int. Cl.
  *G11C 16/34* (2006.01)
  *G11C 16/04* (2006.01)
  *G11C 16/16* (2006.01)

(56) References Cited

U.S. PATENT DOCUMENTS

| | | | |
|---|---|---|---|
| 6,732,221 B2 | 5/2004 | Ban | |
| 8,838,875 B2* | 9/2014 | Park | G06F 12/0246 |
| | | | 711/103 |
| 2012/0096217 A1* | 4/2012 | Son | G06F 12/0246 |
| | | | 711/103 |

OTHER PUBLICATIONS

Chang, Li-Pin, et al., "An adaptive striping architecture for flash memory storage systems of embedded systems," Proc. of Eighth IEEE Symp. on Real-Time and Embedded Technology and Applications, Sep. 27, 2002, 10 pages.

Chang, Yu-Ming et al. "A Disturb-Alleviation Scheme for 3D Flash Memory," 2013 IEEE/ACM International Conference on Computer-Aided Design (ICCAD), Nov. 18-21, 2013, 9 pages.

Chang, Yuan-Hao, et al., "Endurance Enhancement of Flash-Memory Storage Systems: An Efficient Static Wear Leveling Design," DAC 2007, Jun. 4-8, 2007, 6 pages.

Chen, Bainan et al., Error correction for multi-level NAND flash memory using Reed-Solomon codes Bainan Chen et al., IEEE Workshop on Signal Processing Systems, Oct. 8-10, 2008, pp. 94-99.

Chen, Chih-Ping, et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012. 91-92.

Cho, Hyunjin et al. "KAST: K-associative sector translation for NAND flash memory in real-time systems," Design, Automation & Test in Europe Conference & Exhibition, 2009, Apr. 20-24, 2009, 6 pages.

Dong, Guiqiang, et al., On the Use of Soft-Decision Error-Correction Codes in nand Flash Memory, IEEE Transactions on Circuits and Systems I: Regular Papers, vol. 58 , Issue: 2, Feb. 2011, 429-439.

Grupp, L.M. et al. "Characterizing flash memory: Anomalies, observations, and applications," 42nd Annual IEEE/ACM International Symposium on Microarchitecture, 2009 (MICRO-42), Dec. 12-16, 2009, 10 pages.

Gupta et al, "DFTL: a flash translation layer employing demand-based selective caching of page-level address mappings," ASPLOS XIV, Proceedings of the 14th international conference on Architectural support for programming languages and operating systems, Mar. 7-11, 2009, pp. 229-240.

Huang, Po-Chun et al. "Joint management of RAM and flash memory with access pattern considerations," 2012 49th ACM/EDAC/IEEE Design Automation Conference (DAC), Jun. 3-7, 2012, 6 pages.

Hung, Chun-Hsiung et al., "A highly scalable vertical gate (VG) 3D NAND Flash with robust program disturb immunity using a novel PN diode decoding structure," 2011 Symp. on VLSI Technology (VLSIT), Jun. 14-16, 2011, 2 pages.

Jang, Jaehoon, et al., "Vertical cell array using TCAT(Terabit Cell Array Transistor) technology for ultra high density NAND flash memory," 2009 Symp. on VLSI Technology, Jun. 16-18, 2009, 2 pages.

Katsumata et al., "Pipe-shaped BiCS flash memory with 16 stacked layers and multi-level-cell operation for ultra high density storage devices," 2009 Symp. on VLSI Technology, Jun. 16-18, 2009, 2 pages.

Kim, et al., Novel Vertical-Stacked-Array-Transistor (VSAT) for ultra-high-density and cost-effective NAND Flash memory devices and SSD (Solid State Drive), 2009 Symposium on VLSI Technology Digest of Technical Papers, Jun. 16-18, 2009, pp. 186-187.

Kim, Jesung et al., "A space-efficient flash translation layer for CompactFlash systems," IEEE Transactions on Consumer Electronics, vol. 48, No. 2, May 2002, 10 pages.

Kim, Wonjoo, et al., "Multi-layered Vertical Gate NAND Flash overcoming stacking limit for terabit density storage," 2009 Symp. on VLSI Technology, Jun. 16-18, 2009, 2 pages.

Lee et al., LAST: locality-aware sector translation for NAND flash memory-based storage systems, ACM SIGOPS Operating Systems Review, vol. 42 Issue 6, Oct. 2008, pp. 36-42.

Lee, Chang-Hyun et al. "Highly scalable NAND flash memory with robust immunity to program disturbance using symmetric inversion-type source and drain structure," Symposium on VLSI Technology, 2008, Jun. 17-19, 2008, 118-119.

Lee, Sang-Won et al., "FAST: An Efficient Flash Translation Layer for Flash Memory," EUC 2006 Workshops: NCUS, SecUbiq, USN, TRUST, ESO, and MSA, Seoul, Korea, Aug. 1-4, 2006. Proceedings Pages pp. 879-887.

Liu, Wei et al. "Low-Power High-Throughput BCH Error Correction VLSI Design for Multi-Level Cell NAND Flash Memories," IEEE Workshop on Signal Processing Systems Design and Implementation, 2006. SIPS '06. Oct. 2006, 6 pages.

Lu, Chih-Yuan et al., "Future challenges of flash memory technologies," Microelectronic Engineering, vol. 86, Issue 3, Mar. 2009, pp. 283-286.

Lue, Hang-Ting, et al., "A highly scalable 8-layer 3D vertical-gate (VG) TFT NAND Flash using junction-free buried channel BE-SONOS device," 2010 Symposium on VLSI Technology (VLSIT), Jun. 15-17, 2010, 2 pages.

Murugan, M. et al., "Rejuvenator: A static wear leveling algorithm for NAND flash memory with minimized overhead," 2011 IEEE 27th Symposium on Mass Storage Systems and Technologies (MSST), May 23-27, 2011, 12 pages.

Seo, Joo Yun et al., "Investigation into the effect of the variation of gate dimensions on program characteristics in 3D NAND flash array," 2012 IEEE Silicon Nanoelectronics Workshop (SNW), Jun. 10-11, 2012, 2 pages.

Shim et al. "Inherent Issues and Challenges of Program Disturbance of 3D NAND Flash Cell," 2012 4th IEEE International Memory Workshop (IMW), May 20-23, 2012, 4 pages.

Shin,Yunseung "Non-volatile memory technologies for beyond 2010," 2005 Symposium on VLSI Circuits, Digest of Technical Papers, Jun. 16-18, 2005, 4 pages.

Tanaka, H., et al., "Bit Cost Scalable Technology with Punch and Plug Process for Ultra High Density Flash Memory," IEEE Symposium on VLSI Technology, Jun. 12-14, 2007, 2 pages.

U.S. Appl. No. 14/060,296 entitled "Memory Disturb Reduction for Nonvolatile Memory," filed on Oct. 22, 2013, 36 pages.

Wang, Yi et al. "3D-FlashMap: A physical-location-aware block mapping strategy for 3D NAND flash memory," Design, Automation & Test in Europe Conference & Exhibition 2012, Mar. 12-16, 2012, 6 pages.

Whang, SungJin et al. "Novel 3-dimensional Dual Control-gate with Surrounding Floating-gate (DC-SF) NAND flash cell for 1Tb file storage application," 2010 IEEE Int'l Electron Devices Meeting (IEDM), Dec. 6-8, 2010, 4 pages.

Wu, Chin-Hsien et al. "An Adaptive Two-Level Management for the Flash Translation Layer in Embedded Systems," IEEE/ACM International Conference on Computer-Aided Design 2006. ICCAD '06, Nov. 5-9, 2006, 6 pages.

* cited by examiner

HALF BLOCK MANAGEMENT FOR FLASH STORAGE DEVICES

RELATED APPLICATION

This application is a non-provisional which claims the benefit of Provisional Application No. 61/811,821 entitled Disturb-Alleviation Scheme for NAND Flash Memory, filed 15 Apr. 2013, which is incorporated herein by reference.

TECHNICAL FIELD

This disclosure generally relates to memory devices.

DESCRIPTION OF RELATED ART

Flash memory is a popular type of high capacity, non-volatile memory. Flash memory can be configured for operations including block erase, word or byte program, page program, word or byte read and page read. The size of a block of memory for the purposes of a block erase can be determined by the configuration of the memory array, and may be larger than a page for example.

Many flash memory technologies have limited endurance. That is the ability to reliably store data degrades as the number of program and erase cycles grows beyond safe limits.

It is desirable to provide block erase management methods that increase block utilization and reduce block-erase counts for memory of this type.

SUMMARY

A method for managing block erase operations for an array of memory cells including erasable blocks of memory cells in the array is described. As set forth below, status data can be maintained for a plurality of sub-blocks of corresponding erasable blocks of the array. The status data indicates whether the sub-blocks are currently accessible (e.g., available for programming or reading) and whether the sub-blocks are invalid (e.g., not available for programming or reading). The method comprises, in response to a request to erase a selected sub-block of a particular erasable block, updating the status data of the selected sub-block based on the status data of the other sub-block or sub-blocks of the particular erasable block. Also, in response to a request to erase data in a selected sub-block of a particular erasable block, an erase command can be issued to erase the particular block if the other sub-blocks of the particular erasable block are invalid, else updating the status data to indicate that the selected sub-block is invalid.

Other aspects and advantages of the present technology can be seen on review of the drawings, the detailed description and the claims, which follow.

DETAILED DESCRIPTION

A detailed description of embodiments of the present technology is provided with reference to the Figures.

Figure 1:
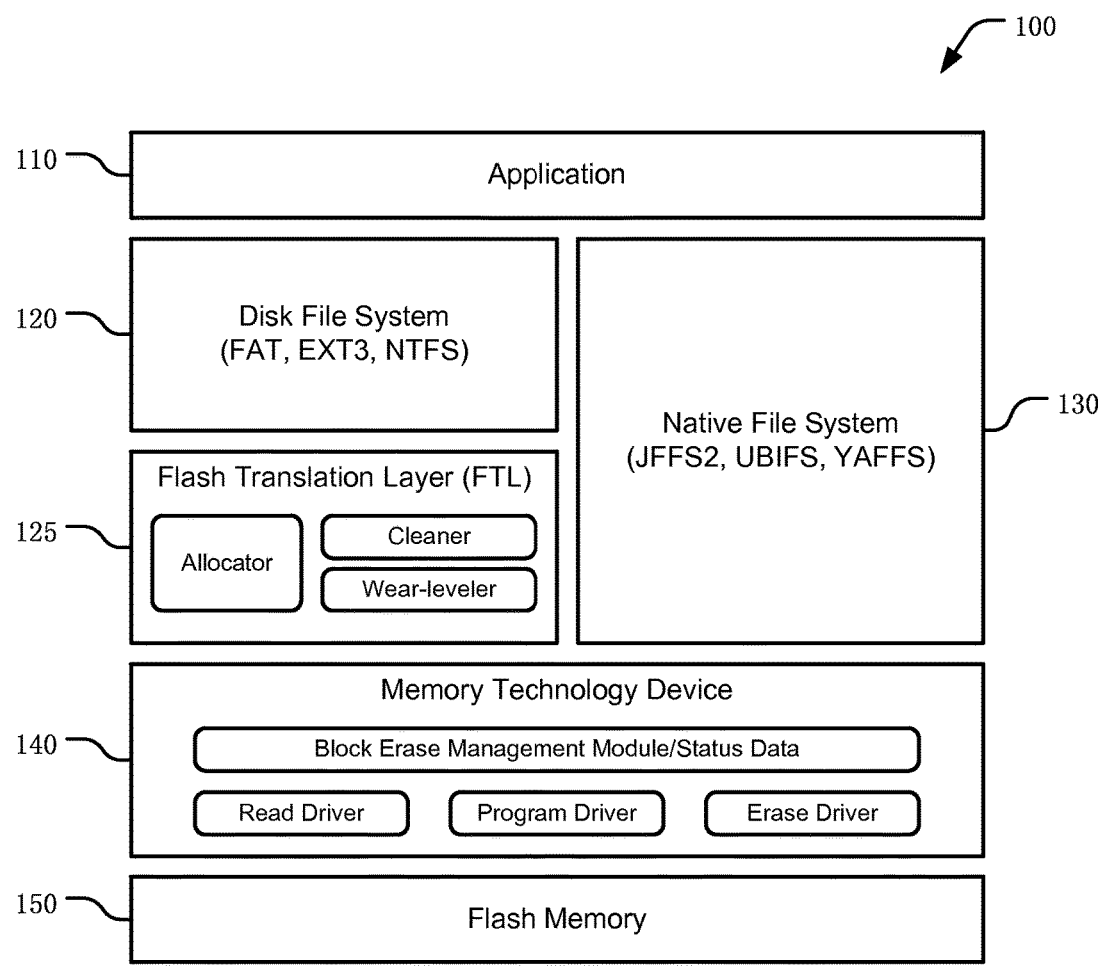
FIG. 1 is a block diagram of a storage system incorporating a flash memory.

FIG. 1 is a block diagram of functional layers of a data processing system 100 incorporating a memory, such as a high capacity 3D NAND flash 150. The memory can be other varieties of NAND flash memory, NOR flash memory, and in the example shown, or any suitable memory device with erasable blocks. The memory can be physically configured into sectors, such that each physical sector is a smallest unit for block erase operations supported by the memory. An erasable block of the memory can correspond for example to one or more physical sectors. For example, each physical sector of the memory can be 16 KB in size. An erasable block of the memory 150 can include one physical sector and have the same 16 KB size as the physical sector. An erasable block of the memory can include 4 physical sectors and have a size of 64 KB. An erasable block of the memory can include 8 physical sectors and have a size of 128 KB.

In memory configured for page mode operations, each erasable block of the memory can include multiple pages, and each page can be programed or read by page program and page read operations supported by the memory. For example, a 1-Gbit single-level-cell (SLC) NAND flash memory device can include 1K erasable blocks of 128 KB each in size. Each erasable block can include 64 pages of 2 KB each in size. Each page can include additional storage space (e.g., 64 Byte) for error correction code (ECC) or other functions. Each erasable block can include additional storage space (e.g., 4 KB) for recording bad pages, erase counters, or other data.

A flash memory can be configured so that a page of the memory can be programed or read by supplying to the memory a page program or page read command and an address corresponding to the page. Also, the flash memory can be configured so that each block of the memory can be erased by supplying to the memory a block erase command and an address corresponding to the block. For example, each particular page of the example 1-Gbit SLC NAND flash memory device above can be addressable with a 16-bit address, while the 10 most significant bits of the 16-bit address are the address of the block including the particular page. In this 1-Gbit SLC NAND example, a page can be programed or read by supplying to the 1-Gbit SLC NAND flash memory device a page read or page program command and a 16-bit address corresponding to the page. In this 1-Gbit SLC NAND example, an erasable block can be erased by supplying to the 1-Gbit SLC NAND flash memory device a block erase command and the 10 most significant bits (in the 16-bit address format) corresponding to the erasable block.

The system 100 includes a file system or file systems that store, retrieve, and update data stored in the memory 150 based on requests from an application program 110. The file system in the illustrated example includes disk file system 120 such as File Allocation Table (FAT) file system, Third Extended File System (EXT3), or New Technology File System (NTFS). The file system in the illustrated example also includes a native file system 130 designed for flash memories such as Journaling Flash File System Version 2 (JFFS2), Unsorted Block Image File System (UBIFS), or Yet Another Flash File System (YAFFS). The file system 120 or 130 accesses the memory 150 through device drivers such as a read driver (for page read operations), a program driver (for page program operations), and an erase driver (for block erase operations). A software layer such as a Memory Technology Device file 140 can provide an interface between the device drivers and the file system 120 or 130.

The system 100 as illustrated also includes Flash Translation Layer 125 serving as an interface between the disk file system 120 and the device drivers (or the Memory Technology Device file 140). The Flash Translation Layer 125 can perform address translation between logical addresses of the disk file system 120 and physical addresses of the memory 150. The Flash Translation Layer 125 includes an allocator module that allocates physical memory space in the memory 150. The Flash Translation Layer 125 includes a cleaner module that reclaims unused physical space in the memory 150. The Flash Translation Layer 125 includes a wear-leveler module that performs wear leveling procedures on the memory 150.

Components of the system 100 can make requests to erase an erasable block of the memory 150. For example, the wear-leveler module (or the Native File System 130) can perform a wear leveling procedure that transfers data stored in pages of a first erasable block of the memory 150 to a second erasable block of the memory 150 (e.g., by accessing the read and program drivers in the Memory Technology Device file 140). After the data is transferred, the wear-leveler module maps logical addresses for the data to physical addresses of pages in the second erasable block storing the transferred data, and requests the Memory Technology Device file 140 to erase the first erasable block. For example, the allocator module can allocate an erasable block of the memory 150 by requesting the Memory Technology Device file 140 to erase the erasable block (e.g., to make room for page write operations). For example, the cleaner module can identify in the memory 150 an erasable block with obsolete data, and reclaim the erasable block by requesting the Memory Technology Device 140 file to erase the erasable block.

Other functions in the system 100 may require operations that require an erase of an erasable block in order to complete. For some write commands directed to a logical address, the physical address is determined and a sequence of commands performed in order to write the data in the physical address. The sequence of commands may include block erase operations, to free the physical address for program operations. Also, a disk file system 120 via the flash translation layer 125, and a native file system 130 may produce requests to the Memory Technology Device 140 to erase data in erasable blocks for a variety of reasons.

Figure 2:
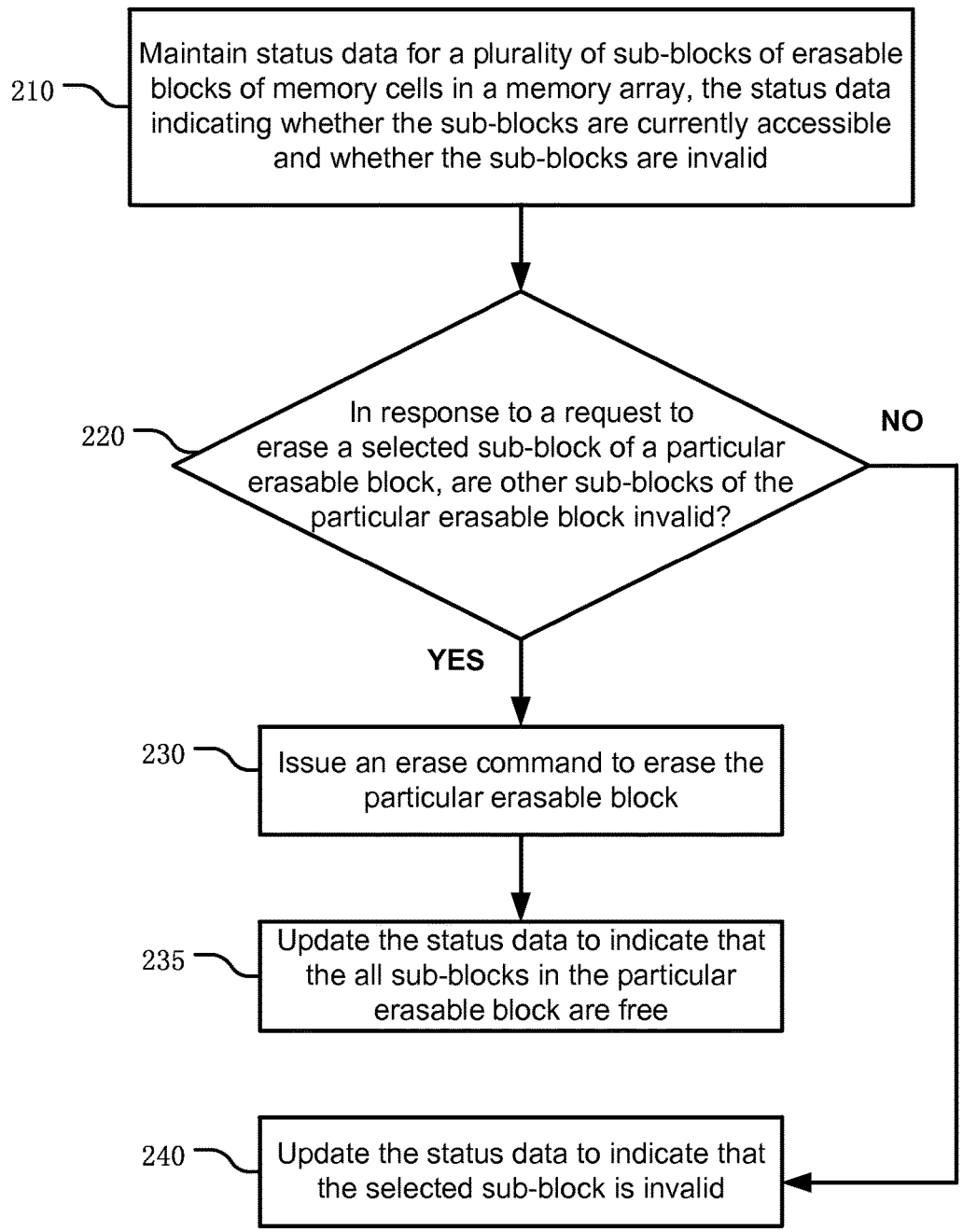
FIG. 2 is a flow chart of a method for block erase management.

FIG. 2 is a flow chart of a method for block erase management of an array of memory cells including erasable blocks of memory cells in the array. For example, the array of memory cells or memory array can be a NAND flash memory, a phase change memory, or any suitable memory with erasable blocks of memory cells.

The memory array can be part of a storage system. For example, the memory array can be the memory 150 of the system 100 illustrated in FIG. 1. A method for block erase management can be implemented with software running on the system 100. For example, the method can be implemented with a block erase management module as part of the Memory Technology Device file 140. Such implementation of the method for block erase management can be transparent to the file system 120 or 130. Alternatively, the method of block erase management can be implemented with software as part of the Flash Translation Layer 125 or the native file system 130. The software or program codes implementing the method for block erase management can be stored in one or more non-transitory computer-readable storage media such as one or more integrated circuits, hard disk drives, DRAM devices, flash memory devices, any suitable computer-readable non-transitory storage media, or any suitable combination of these. For example, the software or program codes implementing the method for block erase management can be stored in a hard disk drive of a computing device accessing the memory 150. For another example, the software or program code implementing the method for block erase management can be stored in a storage area of the memory 150 together with one or more drivers for the memory device 150.

In the example illustrated, the block erase management module in the memory technology device layer 140 includes status data supporting the block erase management process described herein. The status data indicates a block erase status for some or all or the erasable blocks in the memory. Logically, the status data partitions each erasable block of the memory array into a plurality of sub-blocks. The plurality of sub-blocks can be equal in size. For example, an erasable block may include two sub-blocks and each sub-block is a half block of the erasable block. For another example, an erasable block may include four sub-blocks and each sub-bock has a size of 25% of the erasable block.

The status data of a sub-block can be organized to indicate or mark whether the sub-block is accessible and whether the sub-block is invalid. In one configuration, the status data can include "in-use", "free" and "invalid" states for each erasable block subject of the block erase management process described herein. In this configuration, the status data of a sub-block indicates the sub-block is in-use if the sub-block is accessible and contains stored data (e.g., data programed into one or more pages the sub-block by the file system). The status data of a sub-block indicates the sub-block is free if the sub-block is accessible and erased, (e.g., pages in the sub-block have not been programed by the file system since the last erase operation applied to the erasable block containing the sub-block). The status data of a sub-block can indicate the sub-block is invalid if the sub-block is not accessible to the file system (i.e., has been subject of an erase request, but the erasable block was not erased as a result of the request). Data stored in a sub-block marked as invalid are not accessible to the file system. The method can store and maintain the status data in a table. The table can be stored in a local storage (e.g., DRAM, hard disk drive, solid state drive) of a computing device executing the software implementing the method. Also, copies of the table may be stored in non-volatile memory, including for example the memory array, for use in recovery after power down events and the like.

Other components in the system 100 incorporating the memory array can make requests to erase a sub-block of an erasable block of the memory array. That is, other components of the system that produce requests based on physical addresses can be configured to operate using a sub-block as a management unit for block erase operations. For example, the wear-leveler module can transfer data stored in a sub-bock of a first erasable block of the memory 150 to another erasable block, and request the block erase management module to erase the sub-block of the first erasable block. For example, the allocator module can allocate a sub-block of an erasable block of the memory 150 by requesting the block erase management module to erase the sub-block. For example, the cleaner module can reclaim a sub-block of an erasable block of the memory 150 by requesting the block erase management module to erase the sub-block.

FIG. 2 is a flow chart illustrating a block erase management process that can be implemented in a system like that of FIG. 1. The process maintains status data for the plurality of sub-blocks of the erasable blocks in the memory array (Step 210). In response to a request to erase data in a selected sub-block of a particular erasable block, the method updates the status data of the selected sub-block based on the status data of the other sub-block or sub-blocks of the particular erasable block. More particularly, in response to the request to erase data in the selected sub-block of the particular erasable block, the method determines whether the other sub-blocks of the particular erasable block are invalid (Step 220). If all the other sub-blocks of the particular erasable block are currently marked as invalid, the method issues an erase command to erase the particular erasable block (Step 230). Then, all of the sub-blocks of the erasable block can be marked free. (Step 235). If at step 220, it is found that at least one of the other sub-blocks of the particular erasable block is currently accessible, the method updates the status data to indicate that the selected sub-block is invalid (Step 240), and need not execute the requested block erase.

For example, in response to a request made by the wear-leveler module to erase data in a selected sub-block of a particular erasable block of memory 150, the block erase management module determines whether the other sub-blocks of the particular erasable block are currently invalid as indicated by the status data for the memory 150. If the other sub-blocks of the particular erasable block are not all invalid, the block erase management module updates the status data to mark the selected sub-block as invalid. If the other sub-blocks of the particular erasable block are all invalid, the block erase management module issues an erase command (and a corresponding physical address) to erase the particular erasable block. Furthermore, after issuing the erase command to the erase driver to erase the particular erasable block, the block erase management module updates the status data to mark all the sub-blocks of the particular erasable block as free or accessible.

Figure 3A:
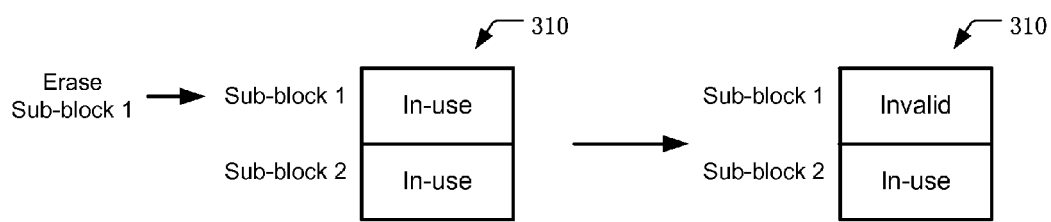
FIGS. 3A-3F illustrate status changes for example sub-block operations for a block erase management system.

FIGS. 3A to 3F illustrate changed in status data for example sub-blocks of erasable blocks in various operations. Each erasable block illustrated in FIGS. 3A to 3F is logically partitioned into two sub-blocks (sub-block 1 and sub-block 2). As illustrated in the left-hand side of FIG. 3A, both sub-blocks 1 and 2 of the erasable block 310 are marked as in-use. With reference to FIG. 3A, for example, in response to a request to erase the sub-block 1 of the erasable block 310 the sub-block 1 is marked as invalid while the sub-block 2 keeps the in-use status, as illustrated in the right-hand side of FIG. 3A. As only the sub-block 1 is marked as invalid, data in the sub-block 2 are still accessible. For example, a file system (or an address translation layer) can issue page read or program request for the pages in the sub-block 2 of the erasable block 310

Figure 3B:
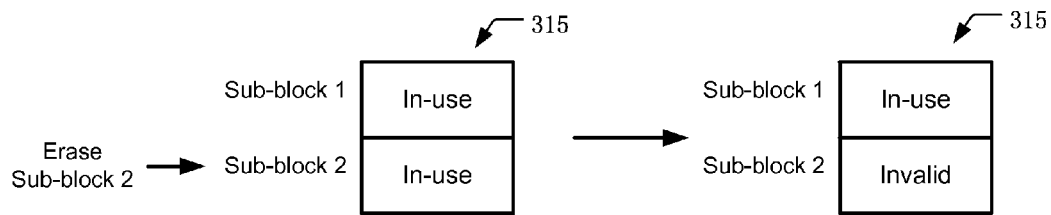

Also, in FIG. 3B, both sub-blocks 1 and 2 of the erasable block 315 are initially marked as in-use. In response to a request to erase the sub-block 2 of the erasable block 315 illustrated in the left-hand side of FIG. 3B, the method marks the sub-block 2 as invalid as the sub-block 1 is currently in-use. The erasable block 315 after its sub-block 2 being marked as invalid is illustrated in the right-hand side of FIG. 3B. Data stored in the sub-block 1 of the erasable block 315 is still accessible after the sub-block 2 is marked as invalid.

Figure 3C:
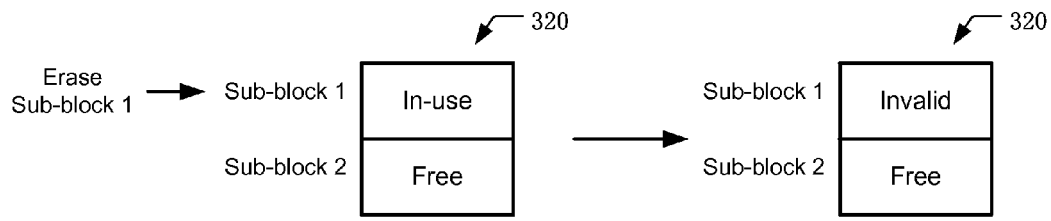

In FIG. 3C, in erasable block 320, the first sub-block is initially marked in-use, while the second sub-block is marked "free." As illustrated in FIG. 3C, in response to a request to erase the sub-block 1 of the erasable block 320, the sub-block 1 is marked as invalid as the sub-block 2 of the erasable block 320 is currently marked as free as illustrated in the right-hand side of FIG. 3B. The sub-block 2 of the erasable block 320 is still accessible after the sub-block 1 is marked as invalid.

Figure 3D:
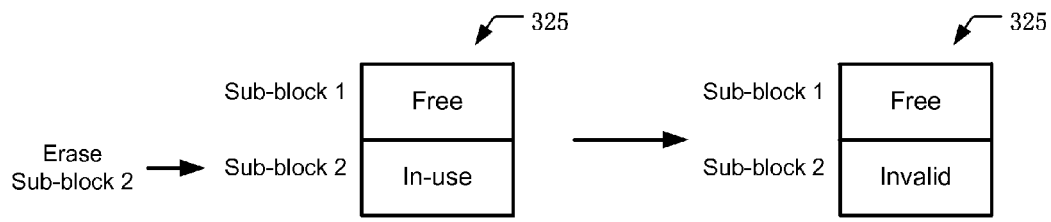

In FIG. 3D, in erasable block 325, the first sub-block is initially marked in-use, while the second sub-block is marked "free." As illustrated in FIG. 3D, in response to a request to erase the sub-block 2 of the erasable block 325, the sub-block 2 is marked as invalid as the sub-block 1 of the erasable block 325 is currently marked as free as illustrated in the right-hand side of FIG. 3D. The sub-block 1 of the erasable block 325 is still accessible after the sub-block 2 is marked invalid.

Figure 3E:
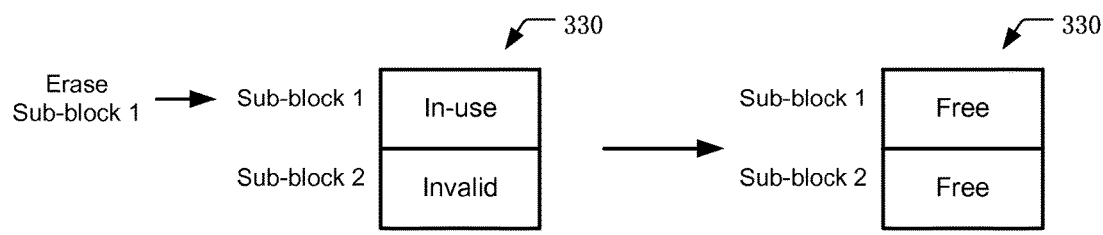

As illustrated in the left-hand side of FIG. 3E, sub-block 1 of the erasable block 330 is marked as in-use while sub-block 2 of the erasable block 330 is marked as invalid. For example, in response to a request to erase the sub-block 1 of the erasable block 330 illustrated in the left-hand side of FIG. 3E, the method erases both the sub-blocks 1 and 2 of the erasable block 330 because the other sub-block of the erasable block, the sub-block 2, is currently invalid. Here, the sub-block 2 being marked as invalid can be the result of that the sub-block 2 has been target of a request to erase when the sub-block 1 remains in use, as illustrated by the erasable block 315 in FIG. 3A. Furthermore, the method updates the status data for the sub-blocks 1 and 2 and marks the sub-blocks 1 and 2 as free. The erasable block 330 after its sub-blocks 1 and 2 being marked as free is illustrated in the right-hand side of FIG. 3E.

Figure 3F:
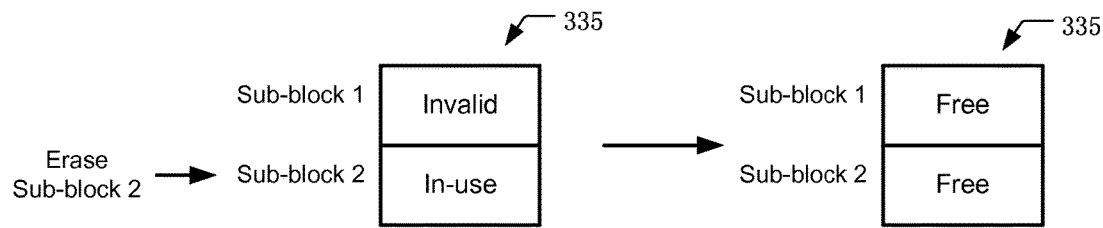

As illustrated in the left-hand side of FIG. 3F, sub-block 1 of the erasable block 335 is marked as invalid while sub-block 2 of the erasable block 335 is marked as in-use. In response to a request to erase the sub-block 2 of the erasable block 335 illustrated in the left-hand side of FIG. 3F, the method erases both the sub-blocks 1 and 2 of the erasable blocks 335, and marks both the sub-blocks 1 and 2 as free. The erasable block 335 after its sub-blocks 1 and 2 being marked as free is illustrated in the right-hand side of FIG. 3F.

In other embodiments, the method erases an entire erasable block if more than a pre-determined number of sub-blocks of the erasable block have been targets of requests to erase when other sub-blocks are in use. For example, the method can partition each erasable block into four sub-blocks, and maintains status data for each sub-blocks as discussed earlier. In response to a request to erase a first sub-block of a particular erasable block, the method marks the first sub-block as invalid if less than two of the other sub-blocks of the particular erasable block are currently invalid. If at least two of the other sub-blocks of the particular erasable block are currently marked as invalid (as results of being targeted for erase requests), the method first copies those sub-blocks in the in-use block that have valid data to another bock, and then erases all the sub-blocks of the particular erasable block and marks all the sub-blocks as free.

Figure 4:
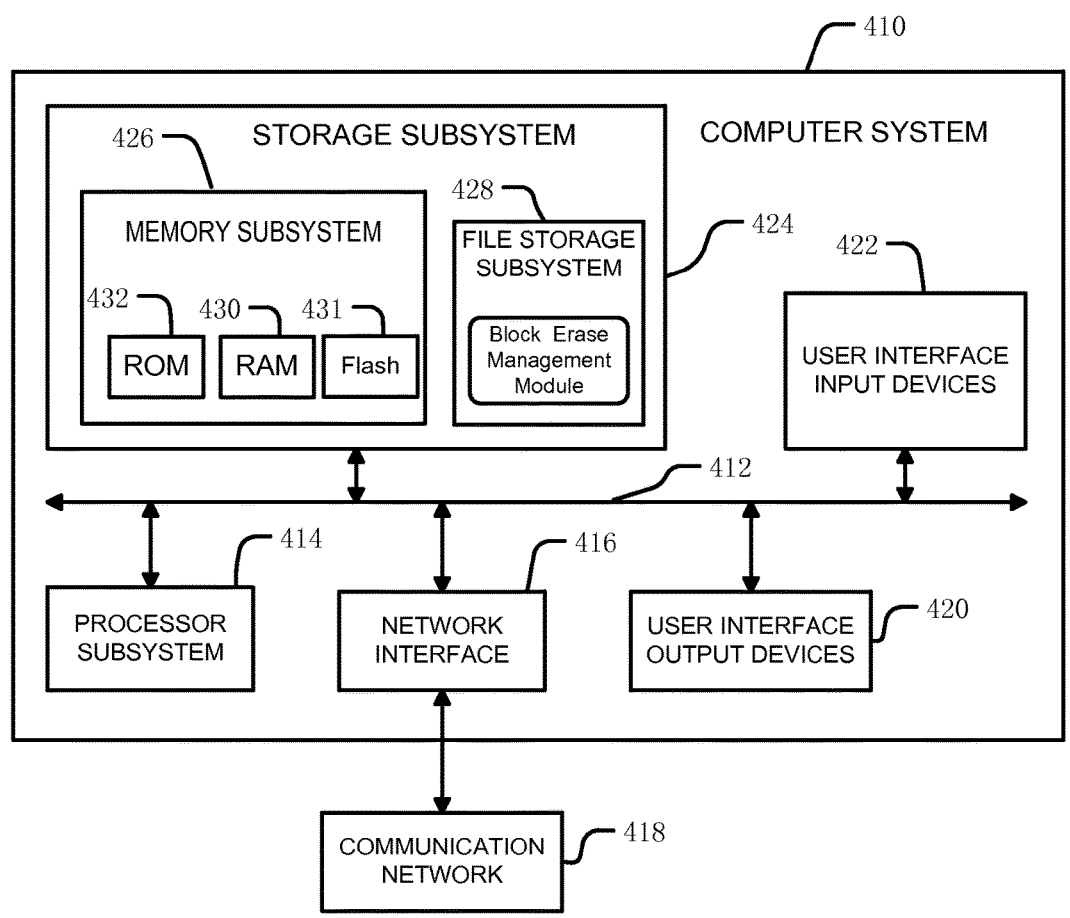
FIG. 4 is a block diagram of a computer system including block erase management resources.

FIG. 4 is a block diagram of a computer system 410 that can include a block erase management module illustrated in FIG. 1.

Computer system 410 typically includes a processor subsystem 414 which communicates with a number of peripheral devices via bus subsystem 412. These peripheral devices may include a storage subsystem 424, comprising a memory subsystem 426 and a file storage subsystem 428, user interface input devices 422, user interface output devices 420, and a network interface subsystem 416. The input and output devices allow user interaction with computer system 410. Network interface subsystem 416 provides an interface to outside networks, including an interface to communication network 418, and is coupled via communication network 418 to corresponding interface devices in other computer systems. Communication network 418 may comprise many interconnected computer systems and communication links. These communication links may be wireline links, optical links, wireless links, or any other mechanisms for communication of information, but typically it is an IP-based communication network. While in one embodiment, communication network 418 is the Internet, in other embodiments, communication network 418 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 422 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 410 or onto computer network 418.

User interface output devices 420 may include a display subsystem, a printer, a fax machine, or non-visual displays such as audio output devices. The display subsystem may include a cathode ray tube (CRT), a flat panel device such as a liquid crystal display (LCD), a projection device, or some other mechanism for creating a visible image. The display subsystem may also provide non visual display such as via audio output devices. In general, use of the term "output device" is intended to include all possible types of devices and ways to output information from computer system 410 to the user or to another machine or computer system.

Storage subsystem 424 stores the basic programming and data constructs that provide the functionality of certain embodiments of the present invention. For example, the various modules implementing the functionality of certain embodiments of the invention may be stored in storage subsystem 424. For example, the block erase management module implementing the method for block erase management described above can be stored in storage subsystem 424. These software modules are generally executed by processor subsystem 414.

Memory subsystem 426 typically includes a number of memories including a main random access memory (RAM) 430 for storage of instructions and data during program execution and a read only memory (ROM) 432 in which fixed instructions are stored. Memory subsystem 426 can also include a flash memory 431. File storage subsystem 428 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 428. The host memory 426 contains, among other things, computer instructions which, when executed by the processor subsystem 414, cause the computer system to operate or perform functions as described herein. As used herein, processes and software that are said to run in or on "the host" or "the computer", execute on the processor subsystem 414 in response to computer instructions and data in the host memory subsystem 426 including any other local or remote storage for such instructions and data.

Bus subsystem 412 provides a mechanism for letting the various components and subsystems of computer system 410 communicate with each other as intended. Although bus subsystem 412 is shown schematically as a single bus, alternative embodiments of the bus subsystem may use multiple busses.

Computer system 410 itself can be of varying types including a personal computer, a portable computer, a workstation, a computer terminal, a network computer, a television, a mainframe, a server farm, or any other data processing system or user device. Due to the ever changing nature of computers and networks, the description of computer system 410 depicted in FIG. 4 is intended only as a specific example for purposes of illustrating the preferred embodiments of the present invention. Many other configurations of computer system 410 are possible having more or less components than the computer system depicted in FIG. 4.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An operating method for a memory, comprising:
   maintaining, for an array of memory cells including erasable blocks of memory cells in the array, status data for a plurality of sub-blocks of the erasable blocks, the status data indicating whether the sub-blocks are currently accessible and whether the sub-blocks are invalid; and in response to a request to erase a selected sub-block of a particular erasable block: determining the status data of the other sub-block or sub-blocks in the particular erasable block, and updating the status data of the selected sub-block to indicate a changed status if the status data of fewer than a pre-determined number of the other sub-block or sub-blocks of the particular erasable block indicates a same status as the changed status, and issuing an erase command to erase the particular erasable block if the status data indicate the pre-determined number of the other sub-block or sub-blocks of the particular erasable blocks is/are invalid, else the changed status of updating the status data to indicate that the selected sub-block is invalid.

2. The method of claim 1, wherein after issuing the erase command to the array, marking the sub-blocks of the particular erasable block as free.

3. The method of claim 1, including:
   if the pre-determined number is greater than one and if the status data indicate at least the pre-determined number of other sub-blocks of the particular erasable block are invalid, then copying data from any in-use sub-blocks in the particular erasable block to a different erasable block, and issuing an erase command to erase the particular erasable block, else the changed status data of the selected sub-block is invalid.

4. The method of claim 1, wherein the plurality of sub-blocks of the particular erasable block includes a first sub-block and a second sub-block, and the sub-block subject to the request is the first sub-block, then
   if the second sub-block of the particular erasable block is currently accessible, marking the first sub-block of the particular erasable block as invalid; and if the second sub-block of the particular erasable block is currently marked as invalid, issuing the erase command to erase the first and second sub-blocks of the particular erasable block.

5. The method of claim 1, wherein the status data indicates that a sub-block of the particular block is invalid if it has been target of a request to erase when other sub-blocks of the particular block remain in-use.

6. The method of claim 1, wherein a sub-block is marked as free if the sub-block is accessible and contains no stored data.

7. The method of claim 1, wherein the array comprises NAND flash memory.

8. The method of claim 1, including address translation logic and wear leveling logic which generate requests to erase selected sub-blocks.

9. A memory apparatus comprising: computer-readable non-transitory memory storing software executable to: maintain, for an array of memory cells including erasable blocks of memory cells in the array, status data for a plurality of sub-blocks of the erasable blocks, the status data indicating whether the sub-blocks are currently accessible and whether the sub-blocks are invalid; and in response to a request to erase a selected sub-block of a particular erasable block: determine the status data of the other sub-block or sub-blocks in the particular erasable block, and update the status data of the selected sub-block to indicate a changed status if the status data of fewer than a pre-determined number of the other sub-block or sub-blocks of the particular erasable block indicates a same status as the changed status, and issue an erase command to erase the particular erasable block if the status data indicate the predetermined number of the other sub-block or sub-blocks of the particular erasable blocks is/are invalid, else the changed status of updating the status data to indicate that the selected sub-block is invalid.

10. The apparatus of claim 9, wherein the software is executable, if the pre-determined number is greater than one and if the status data indicate at least the pre-determined number of other sub-blocks of the particular erasable block are invalid, to copy data from any in use sub-blocks in the particular erasable block to a different erasable block, and issue an erase command to erase the particular erasable block, else the changed status data of the selected sub-block is invalid.

11. The apparatus of claim 9, wherein the plurality of sub-blocks of the particular erasable block includes a first sub-block and a second sub-block, and the sub-block subject to the request is the first sub-block, then
if the second sub-block of the particular erasable block is currently accessible, the software marks the first sub-block of the particular erasable block as invalid; and
if the second sub-block of the particular erasable block is currently marked as invalid, the software issues the erase command to erase the first and second sub-blocks of the particular erasable block.

12. An apparatus comprising: an array of memory cells including erasable blocks of memory cells in the array; and a processor coupled to the array, including logic to: maintain status data for a plurality of sub-blocks of the erasable blocks, the status data indicating whether the sub-blocks are currently accessible and whether the sub-blocks are invalid; and in response to a request to erase a selected sub-block of a particular erasable block; determine the status data of the other sub-block or sub-blocks in the particular erasable block, and update the status data of the selected sub-block to indicate a changed status if the status data of fewer than a pre-determined number of the other sub-block or sub-blocks of the particular erasable block indicates a same status as the changed status, and issue an erase command to erase the particular erasable block if the status data indicate the predetermined number of the other sub-block or sub-blocks of the particular erasable blocks is/are invalid, else update the status data to indicate that the changed status of the selected sub-block is invalid.

13. The apparatus of claim 12, including after issuing the erase command to the array, marking the sub-blocks of the particular erasable block as free.

14. The apparatus of claim 12 wherein the processor is configured to:
if the pre-determined number is greater than one and if the status data indicate at least the pre-determined number of other sub-blocks of the particular erasable block are invalid, then copy data from any in-use sub-blocks in the particular erasable block to a different erasable block, and issue an erase command to erase the particular erasable block, else the changed status data of the selected sub-block is invalid.

15. The apparatus of claim 12, wherein the plurality of sub-blocks of the particular erasable block includes a first sub-block and a second sub-block, and the sub-block subject of the request is the first sub-block, then
if the second sub-block of the particular erasable block is currently accessible, the logic marks the first sub-block of the particular erasable block as invalid; and
if the second sub-block of the particular erasable block is currently marked as invalid, the logic issues the erase command to erase the first and second sub-blocks of the particular erasable block.

16. The apparatus claim 12, wherein the status data indicates that a sub-block of the particular block is invalid if it has been target of a request to erase when other sub-blocks of the particular block remain in-use.

17. The apparatus of claim 12, wherein the array comprises NAND flash memory.

* * * * *